(12) United States Patent
Iwasaki

(10) Patent No.: US 8,625,237 B2
(45) Date of Patent: Jan. 7, 2014

(54) MAGNETIC HEAD AND MAGNETIC RECORDING SYSTEM

(75) Inventor: Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 949 days.

(21) Appl. No.: 12/272,088

(22) Filed: Nov. 17, 2008

(65) Prior Publication Data

US 2009/0154029 A1    Jun. 18, 2009

(30) Foreign Application Priority Data

Dec. 17, 2007   (JP) .................................. 2007-324791

(51) Int. Cl.
    *G11B 5/39*    (2006.01)
(52) U.S. Cl.
    USPC ................... 360/324.2; 428/811.1; 428/811.5
(58) Field of Classification Search
    None
    See application file for complete search history.

(56) References Cited

U.S. PATENT DOCUMENTS

| | | | | |
|---|---|---|---|---|
| 2003/0021072 A1* | 1/2003 | Hayakawa | ................ | 360/324.2 |
| 2004/0091744 A1* | 5/2004 | Carey et al. | .................. | 428/693 |
| 2005/0078418 A1* | 4/2005 | Saito et al. | ................. | 360/324.2 |
| 2006/0018057 A1* | 1/2006 | Huai | ......................... | 360/324.2 |
| 2007/0041132 A1* | 2/2007 | Tondokoro et al. | ........ | 360/324.2 |

FOREIGN PATENT DOCUMENTS

| | | |
|---|---|---|
| JP | 2002-026423 | 1/2002 |
| JP | 2003-086861 | 3/2003 |
| JP | 2006-024294 | 1/2006 |

\* cited by examiner

*Primary Examiner* — Kevin Bernatz

(74) *Attorney, Agent, or Firm* — Antonelli, Terry, Stout & Kraus, LLP.

(57) ABSTRACT

A magnetic reproduction head includes a lower magnetic shield layer, an upper magnetic shield layer, a magnetoresistive film formed between the lower and the upper magnetic shield layers, a refill film in an element height direction disposed in contact with a surface opposite a floating surface of the magnetoresistive film, and a refill film in a track width direction disposed on a side wall surface of the magnetoresistive film. The magnetoresistive film is a tunneling magnetoresistive film including a free layer, an insulating barrier layer, and a fixed layer. The insulating barrier layer is one of a magnesium oxide film, an aluminum oxide film, and a titanium oxide film which contains at least one of nitrogen and silicon.

7 Claims, 15 Drawing Sheets

(Background Art)
FIG.3A
(Background Art)
FIG.3B
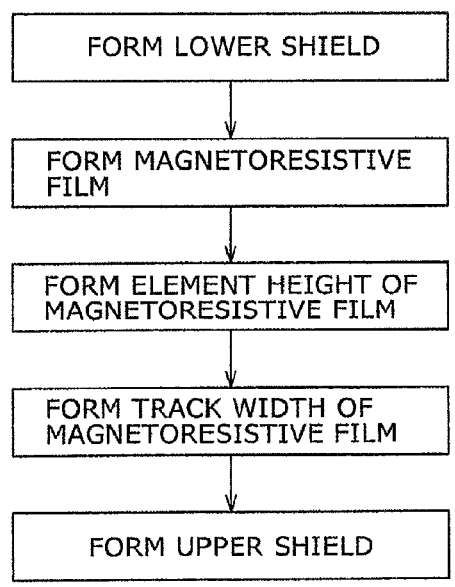
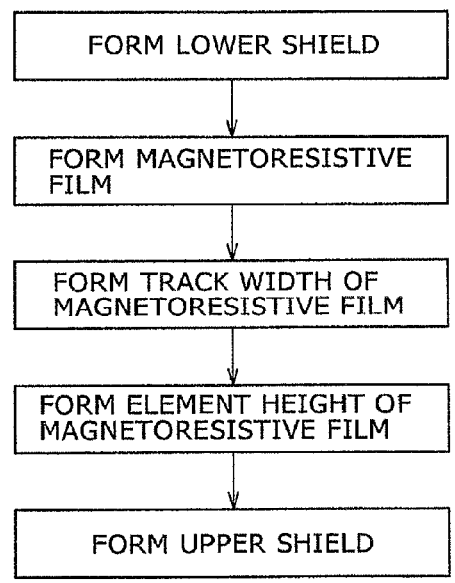

MAGNETIC HEAD AND MAGNETIC RECORDING SYSTEM

BACKGROUND OF THE INVENTION

1. Field of the Invention

The present invention relates to a magnetic head for reproducing magnetically recorded information, and a magnetic recording system equipped with the magnetic head. Specifically, the present invention relates to a magnetic reproduction head with especially high output reproduction, and a magnetic recording system equipped with the magnetic reproduction head.

2. Description of the Related Art

In the magnetic disk device field, the magnetoresistive sensor using the magnetoresistive effect with variable electric resistance in accordance with the change in the external magnetic field has been well known as the high-performance magnetic field sensor. The aforementioned magnetoresistive sensor has been put into practical use as a reproduction element for detecting the signal magnetic field from the magnetic recording medium in the magnetic head as the main component of the magnetic recording/reproduction system.

The recording density of the magnetic recording/reproduction system has been improved at a high pace, requiring the magnetic head to have the minimized track width T while establishing the high performance with respect to such properties as recording and reproducing. The reproducing performance has been improved to have higher sensitivity by developing the MR head using the magnetoresistive effect. In the case of the low recording density of several $Gb/in^2$, the magnetic signal on the recording medium is converted into the electric signal using the anisotropic magnetoresistive effect (AMR). When the recording density is increased to exceed the aforementioned level, Giant Magnetoresistive effect (GMR) with higher sensitivity is employed.

The process for applying the detection current in the direction substantially perpendicular to the film surface, that is, Current-Perpendicular-to-Plane (CPP) process as the advantageous way to achieve the high sensitivity has been developed accompanied with the reduction in the distance (reproducing gap length) between the upper magnetic shield layer and the lower magnetic shield layer so as to meet the needs of further higher recording density. The magnetic reproduction head using CPP-GMR and Tunneling Magnetoresistive effect (TMR) has been introduced.

Referring to FIGS. 1 and 2, the basic structure of the CPP type magnetic reproduction head will be described. FIG. 1 shows a cross section (cross section perpendicular to the direction of the element height) in parallel with the plane opposite the medium of the CPP type magnetic reproduction head. X-axis, Y-axis, and Z-axis shown in FIG. 1 correspond to directions of the track width, element height, and thickness of the magnetoresistive film, respectively. The X-axis, Y-axis, and Z-axis shown in subsequent drawings have the same axes as those shown in FIG. 1. A refill film 1 in the track width is formed in contact with a wall surface of a magnetoresistive film 3 in the track width direction. A longitudinal bias application layer or a side shield layer 5 is formed on the refill film 1. FIG. 1 shows an upper magnetic shield layer 2 and a lower magnetic shield layer 4. FIG. 2 is a sectional view of the CPP type magnetic reproduction head in the element height direction taken along line a-a' of FIG. 1. A medium opposing surface 112 of the magnetic reproduction head is shown at the right side of FIG. 2. Similarly to the track width direction, a refill film 6 in the element height direction is formed in contact with the wall surface of the magnetoresistive element 3. Both the refill film 1 in the track width direction and the refill film 6 in the element height direction are formed mainly of the alumina as the insulating film.

Normally the CPP type magnetic reproduction head is produced such that the upper and the lower magnetic shield layers 2 and 4 are electrically in contact with the magnetoresistive film 3 for reducing the reproducing gap length as small as possible. Each of the upper and the lower magnetic shield layers 2 and 4 serves as an electrode for applying the electric current to the magnetoresistive film 3. The circuit which short-circuits between the upper and the lower magnetic shield layers 2 and 4 besides the magnetoresistive film 3 may form a leak passage of the detection current, thus causing drop in the output.

The side wall surface of the magnetoresistive film 3 is considered as the location on which the short circuit is formed, which may be relevant to the process for producing the magnetic reproduction head. FIG. 3 shows two flowcharts showing steps of forming the CPP type magnetic reproduction head. The process for producing the magnetic reproduction head includes steps of forming the lower magnetic shield layer, forming the magnetoresistive film, patterning the magnetoresistive film, and forming the upper magnetic shield layer. The two processes shown in FIGS. 3A and 3B are different in the order of the steps for forming the element height of the magnetoresistive film, and forming the track width of the film. Those steps may be performed in an arbitrary order depending on the situation.

In the steps of forming the element height and the track width by patterning the magnetoresistive film, the magnetoresistive film 3 is formed on the lower magnetic shield layer 4 as shown in FIG. 4A, and then the magnetoresistive film 3 is protected with a resist mask 101 for forming the track width with a predetermined size, or a resist mask 111 for forming the element height as shown in FIG. 4B. Then the magnetoresistive film 3 has the unnecessary region etched away as shown in FIG. 4C. In the etching step, the etching is normally performed through the ion beam etching process using Ar ion, and through the RIE process using chlorine gas or CO gas. Subsequent to the etching step, the refill film 6 in the element height direction or the refill film 1 in the track width direction is formed as shown in FIG. 4D. Then the resist mask 101 or 111, and the unnecessary refill film are removed through the lift-off process as shown in FIG. 4E to form the element height or the track width of the magnetoresistive film 3. Although not shown in FIG. 4D, a side shield film or a longitudinal bias application layer is further formed on the refill film 1 in the track width direction in the step of forming the track width.

During the etching step shown in FIG. 4C, the subject to be etched is adhered to the wall surface of the magnetoresistive film 3 again, that is, so called reattachment occurs. The reattachment is a stack film formed of the metal for forming the magnetoresistive film 3 or the lower magnetic shield layer 4. The reattachment as the conductive material may form the leak passage of the detection current as described above.

Japanese Published Unexamined Patent Application No. 2003-86861 discloses the method for preventing the leakage of the detection current owing to the reattachment on the wall surface of the magnetoresistive film 3 in the track width direction by oxidizing the reattachment after etching when performing the step of forming the track width. The method allows the oxidized reattachment to be utilized as a portion of the refill film in the track width direction.

Japanese Published Unexamined Patent Application No. 2002-26423 discloses the method for removing the reattachment on the wall surface of the magnetoresistive film 3 by masking the magnetoresistive film 3 formed on the lower magnetic shield layer 4 into a predetermined shape with the resist mask 101 for forming the track width or the resist mask 111 for forming the element height to perform etching by projecting the ion beam at a first incident angle of $\theta_1$, and to further perform etching by projecting the ion beam at a second incident angle $\theta_2$ larger than the incident angle of $\theta_1$ ($\theta_2 > \theta_1$) with respect to the magnetoresistive film 3. The incident angle herein denotes the angle defined by the normal of the substrate and the incident ion.

Japanese Published Unexamined Patent Application No. 2006-24294 discloses the advanced method for performing the two-stage etching process using two refill films having the hardness of the second refill film lower than that of the first refill film so as not to form the region resistant to the incident ion beam for removing the reattachment.

When the track width becomes 50 nanometers or less, the detection current still leaks even though the reattachment is oxidized after etching as disclosed in Japanese Published Unexamined Patent Application No. 2003-86861, or even though the advanced two-stage etching is performed as disclosed in Japanese Published Unexamined Patent Application No. 2006-24294.

BRIEF SUMMARY OF THE INVENTION

It is an object of the present invention to prevent the leakage of the detection current as described above.

According to an aspect of the present invention, the magnetic reproduction head includes a lower magnetic shield layer, an upper magnetic shield layer, a magnetoresistive film formed between the upper and the lower magnetic shield layers, a refill film in an element height direction disposed in contact with a wall surface opposite a floating surface of the magnetoresistive film, and a refill film disposed in contact with both wall surfaces of the magnetoresistive film. The magnetoresistive film as a tunnel magnetoresistive film provided with a free layer, an insulating barrier layer, and a fixed layer is formed as one of a magnesium oxide film, an aluminum oxide film and a titanium oxide film that contains at least one of nitrogen and silicon.

Preferably, the insulating barrier layer contains nitrogen or silicon by 1 at. % or higher.

The magnetic head according to the present invention includes the above-structured magnetic reproduction head and the magnetic recording head.

The magnetic recording system according to the present invention includes the magnetic head, a drive unit for driving a magnetic recording medium in a recording direction, a unit for activating the magnetic head relative to the magnetic recording medium, and a recording/reproduction processor for inputting the signal to the magnetic head and reproducing the signal output from the magnetic head.

According the aspect of the present invention, the magnetic reproduction head with high output and less leakage of the detection current may be provided. The use of the magnetic reproduction head realizes the magnetic recording/reproduction system with high recording density.

BRIEF DESCRIPTION OF THE DRAWINGS

FIG. 3 shows flowcharts of the process for manufacturing the CPP type magnetic reproduction head;

DETAILED DESCRIPTION OF THE EMBODIMENTS

Figure 1:
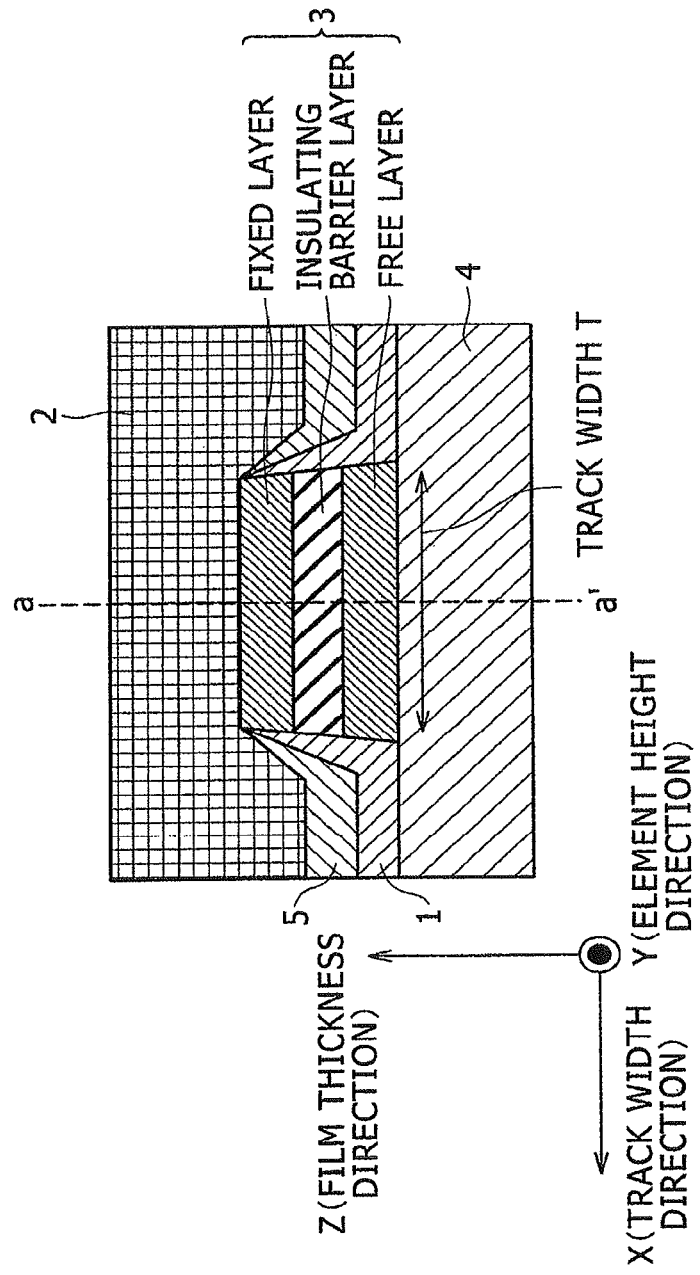
FIG. 1 is a sectional view schematically showing a CPP type magnetic reproduction head in a track width direction.
Figure 2:
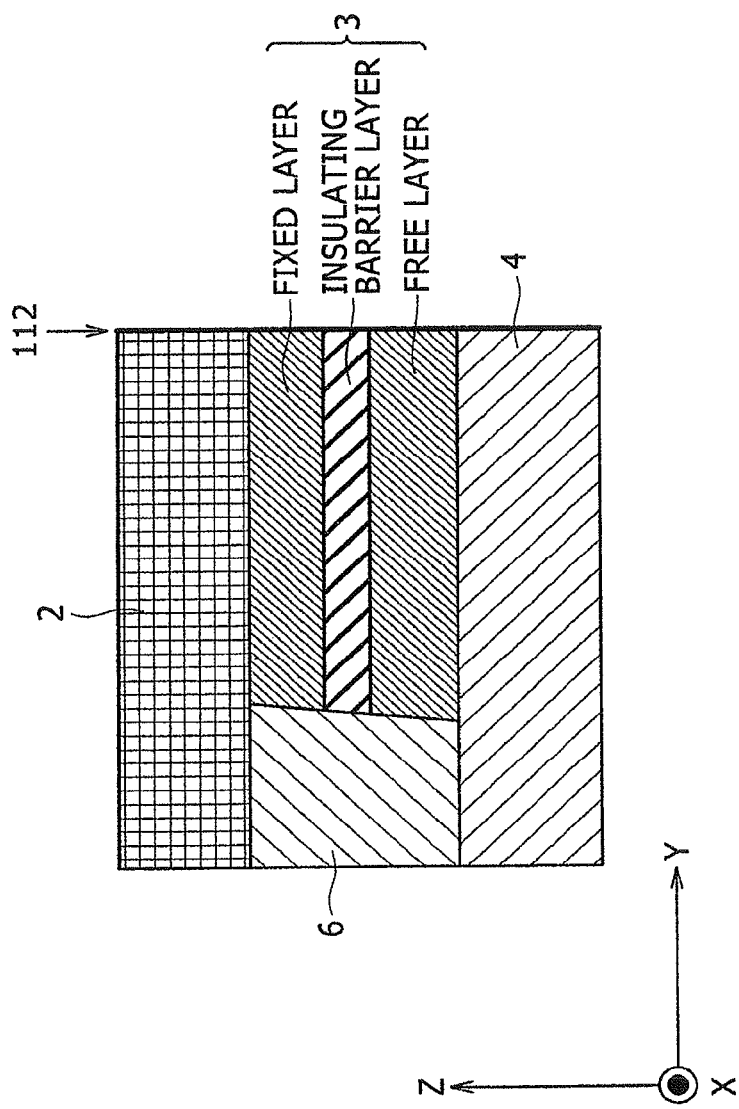
FIG. 2 is a sectional view schematically showing the CPP type magnetic reproduction head in an element height direction taken along line a-a' shown in FIG. 1.
Figure 4A:
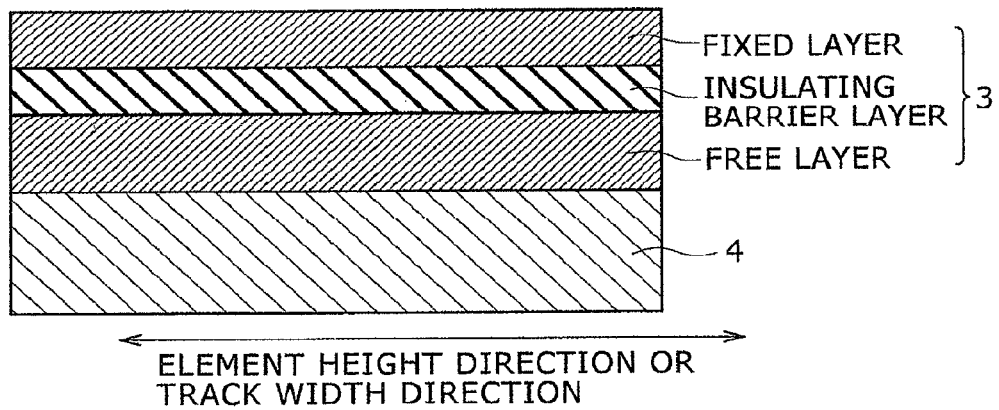
FIG. 4A is a sectional view of a generally employed magnetic reproduction head in the track width direction or in the element height direction in a manufacturing process.
Figure 4B:
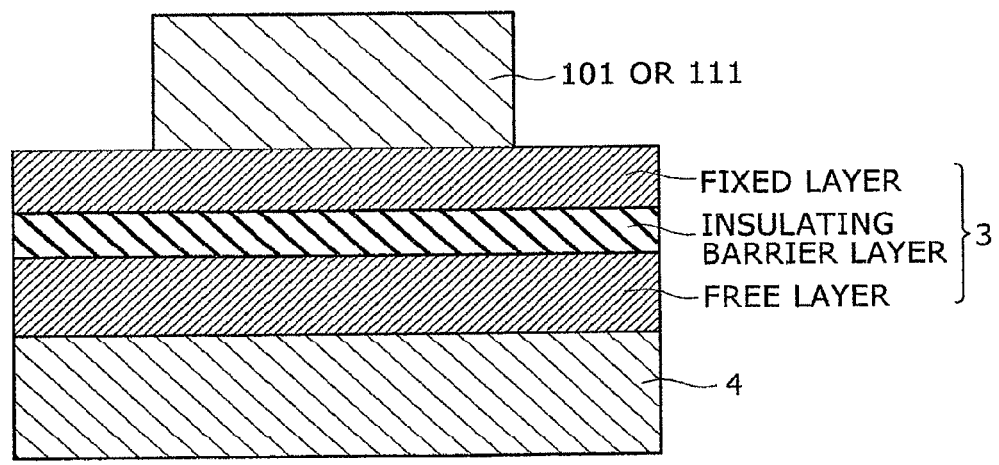
FIG. 4B is a sectional view of the generally employed magnetic reproduction head in the track width direction or in the element height direction in the manufacturing process.
Figure 4C:
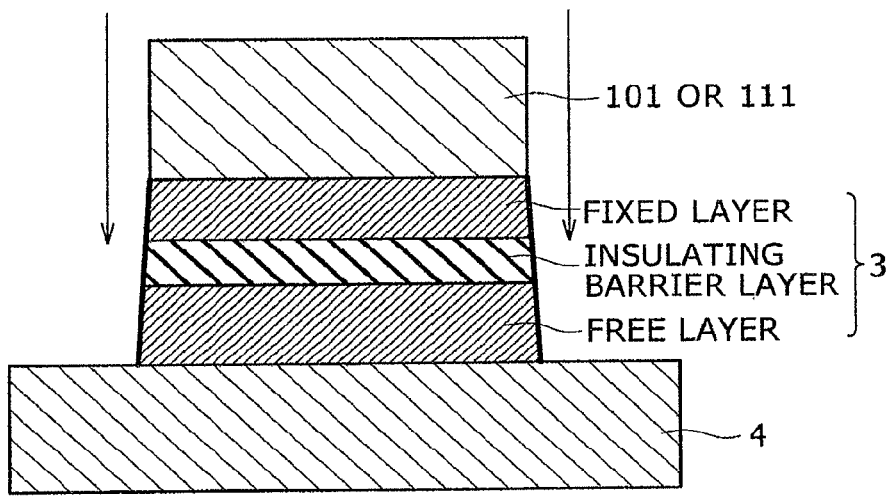
FIG. 4C is a sectional view of the generally employed magnetic reproduction head in the track width direction or in the element height direction in the manufacturing process.
Figure 4D:
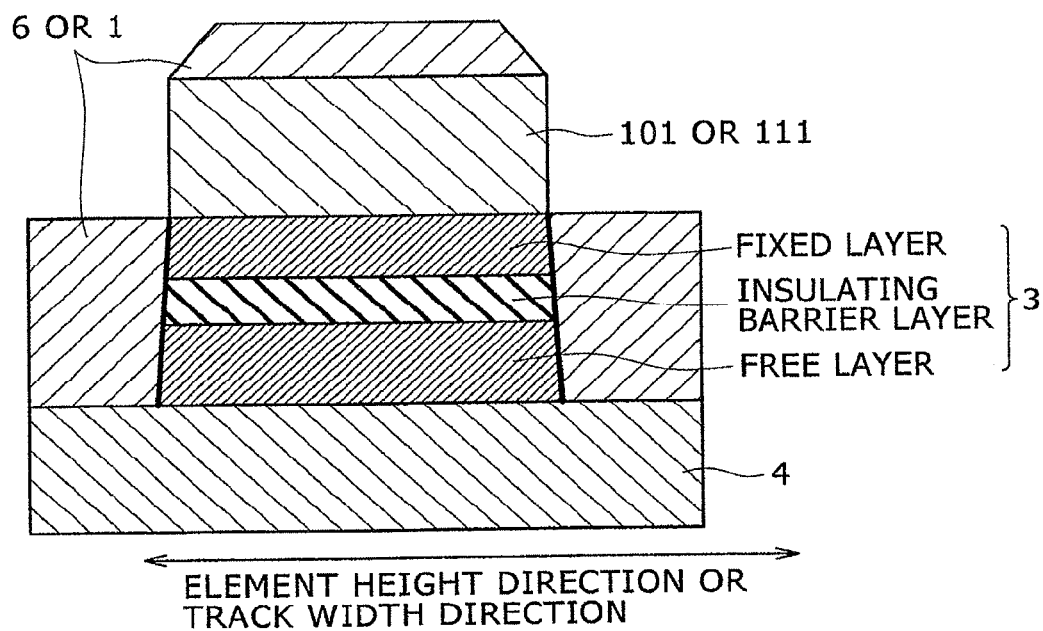
FIG. 4D is a sectional view of the generally employed magnetic reproduction head in the track width direction or in the element height direction in the manufacturing process.
Figure 4E:
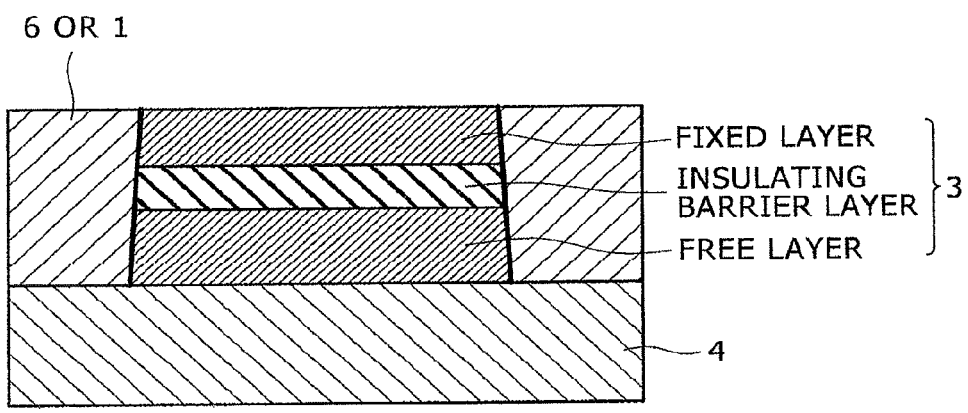
FIG. 4E is a sectional view of the generally employed magnetic reproduction head in the track width direction or in the element height direction in the manufacturing process.

Exemplary embodiments of the present invention will be described in detail referring to the drawings.

First Embodiment

Figure 5:
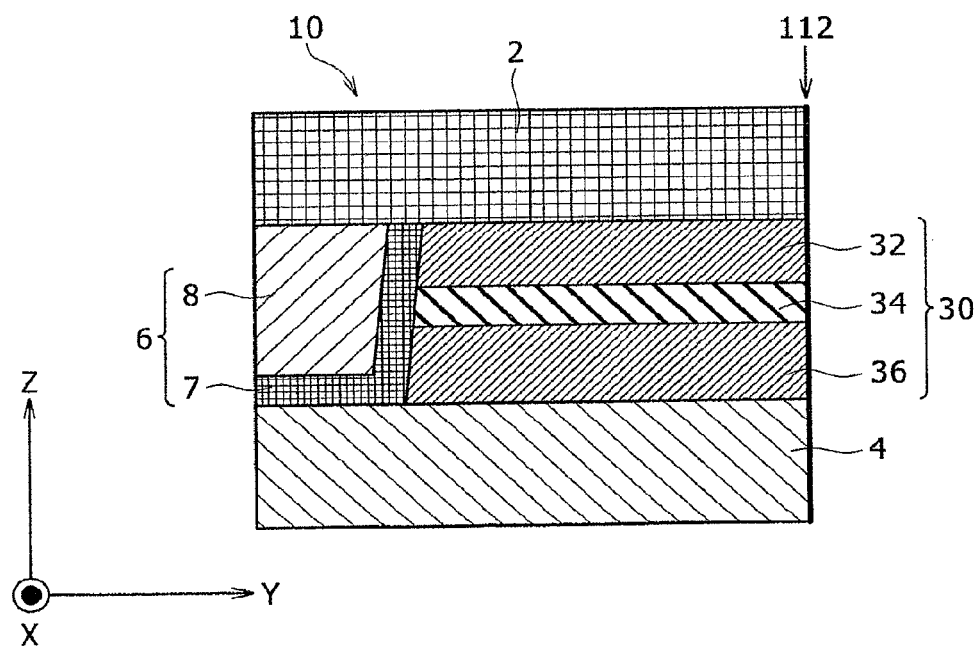
FIG. 5 is a sectional view schematically showing the magnetic reproduction head in the element height direction according to a first embodiment.

FIG. 5 is a sectional view showing a sensor of the magnetic reproduction head in an element height direction according to the first embodiment. FIGS. 6A to 6G are sectional views each in the element height direction with respect to steps of the method for producing the magnetic reproduction head.

A magnetic reproduction head 10 according to the embodiment shown in FIG. 5 is derived from the step of forming the element height first, and then forming the track width as shown in FIG. 3A. Referring to FIGS. 6A to 6G, the method for producing the magnetic reproduction head 10 will be described. A substrate surface (not shown) formed of alumina titanium carbide is coated with such insulator as $Al_2O_3$ so as to be subjected to a fine polishing through chemical mechanical polishing (CMP) process. A lower magnetic shield layer 4 is then formed by patterning the film formed of Ni—Fe alloy produced through sputtering, ion beam sputtering, or plating into a desired shape. The $Al_2O_3$ is grown to be subjected to the CMP process such that the substrate surface becomes the plane where the lower magnetic shield layer 4 and the $Al_2O_3$ are flattened. In the subsequent step, a lead electrode film (not shown) is formed at a portion apart from the position where the magnetoresistive film 30 is formed. The electrode film may be formed of the layered films of Ta, Au and Ta, for example.

Figure 6A:
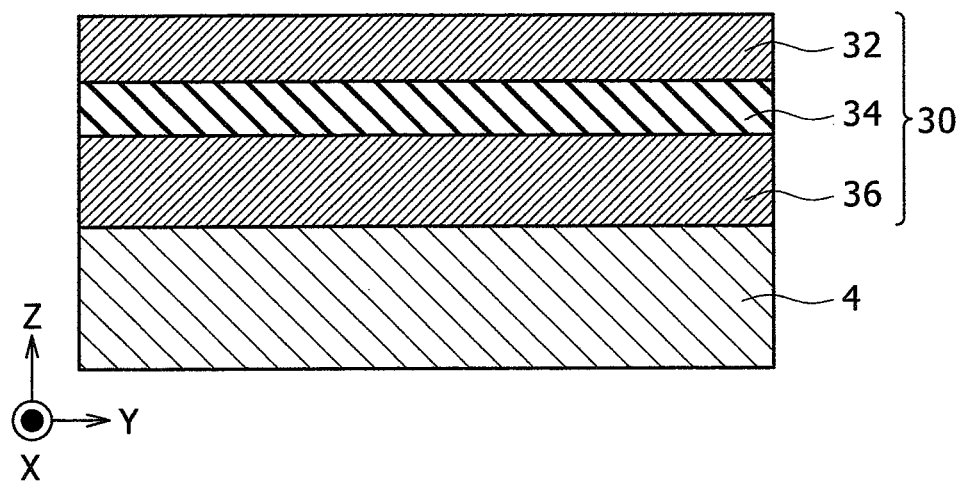
FIG. 6A is a sectional view of the magnetic reproduction head in the element height direction according to the first embodiment in the manufacturing process.

The magnetoresistive film 30 is formed on the lower magnetic shield 4 through the sputtering or the ion beam sputtering process (FIG. 6A). The magnetoresistive film 30 includes a fixed layer 32 formed of a layer which contains ferromagnetic substance such as Co—Fe alloy, an insulating barrier layer 34 formed of magnesium oxide, aluminum oxide, and titanium oxide, and a free layer 36 formed of the layer which contains Ni—Fe alloy or Co—Fe alloy.

Figure 6B:
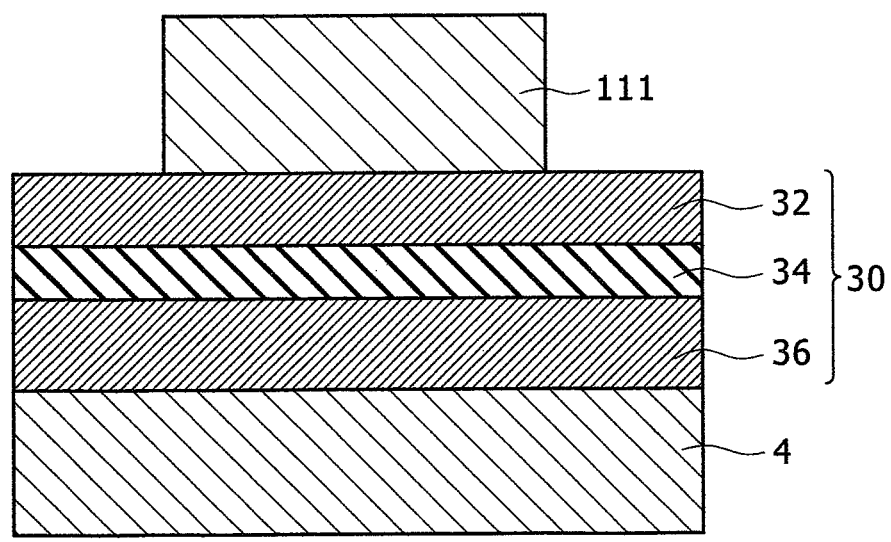
FIG. 6B is a sectional view of the magnetic reproduction head in the element height direction according to the first embodiment in the manufacturing process.
Figure 6C:
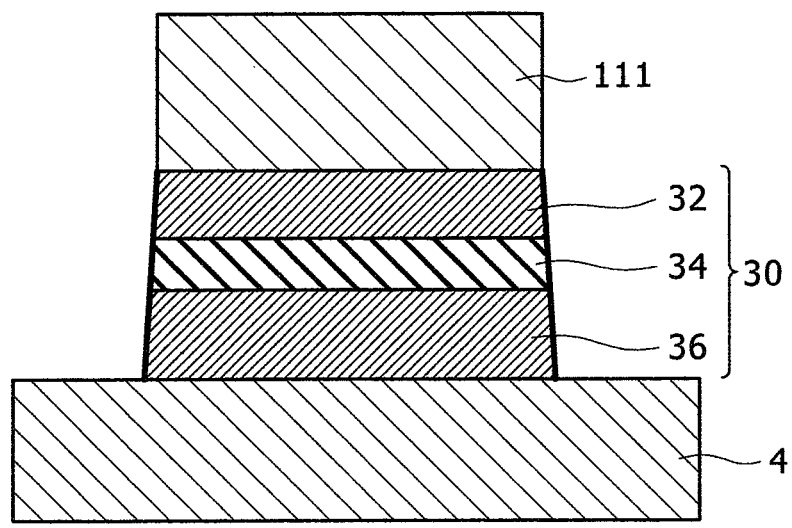
FIG. 6C is a sectional view of the magnetic reproduction head in the element height direction according to the first embodiment in the manufacturing process.

In order to form the film in the element height direction, a resist is applied on the magnetoresistive film 30 and exposed by an exposure unit, and then developed with the development liquid to form a resist mask (lift-off mask) 111 for forming the element height through patterning into the desired shape (see FIG. 6B). The lift-off mask 111 may be produced by applying polydimethyl glutarimido below the resist to have a double layer structure through patterning performed simultaneously with the resist. Then the magnetoresistive film 30 is subjected to dry etching (first etching), for example, the ion beam etching, the reactive ion etching (RIE) for forming the pattern in the element height direction through the etching (FIG. 6C).

The ion beam etching (second etching) is performed with respect to the substrate again at a second incident angle larger than the incident angle of the first etching for removing the reattachment adhered onto the wall surface of the element during the first etching. It is preferable to set the incident angle for the second etching to 60 to 80°. The element height may be formed by performing the first etching and the second etching plural times alternately. Alternatively, the etching at the ion incident angle which is different from those of the first and the second etchings may be performed between the alternatively performed first and the second etching operations.

The oxygen loss caused by leakage of oxygen from the side wall surface of the insulating barrier layer formed of an oxide film of the magnetoresistive film has been discovered in the aforementioned etching step. The oxygen loss deteriorates the insulating property of the oxide film to cause the detection current leakage even if the reattachment layer is removed. In the case of the magnetic head with the track width of 50 nanometers or less, the problem of the aforementioned leakage becomes especially serious as the oxygen atoms becomes active and are likely to leak. As a result of the study for suppressing the oxygen loss, the inventors have discovered that it is effective to allow the insulating barrier layer to contain at least one of nitrogen and silicon. More preferably, it is effective to allow the insulating barrier layer formed of the oxide film to contain at least one of nitrogen and silicon by 1 at. % or higher. The oxygen loss may be prevented by forming the oxide film using the aforementioned material, thus reducing the track width.

The refill film (first refill film) 6 in the element height direction formed of plural layers is formed through the sputtering process or the ion beam sputtering process. In the subsequent first etching in the etching step for forming the track width, it is preferable to set the structure and the film thickness of the refill film 6 in the element height direction such that each of the refill film 6 in the element height direction and the magnetoresistive film 30 has the same etching depth. This may prevent the portion resistant to the incident ion beam from being formed in the subsequent track width forming step where the second etching is performed for removing the reattachment. The aforementioned process is explained in Japanese Published Unexamined Patent Application No. 2006-24294. The first refill film 7 of the refill film 6 in the element height direction in direct contact with the magnetoresistive film 30 is an insulating film. It is preferable to use the alumina for forming the insulating film 7 so as to suppress deterioration in the property of the magnetoresistive film 30 caused by the thermal process.

A second refill film 8 of the refill film 6 in the element height direction formed on the first refill film 7 may be formed of either the insulating material or the metal material. Preferably, the etching rate of the first etching in the track width forming step is faster with respect to the first refill film 7 so as not to form the portion resistant to the incident ion beam at the time of the second etching for removing the reattachment in the subsequent track width forming step.

In the case where the ion beam etching is performed as the first etching in the track width forming step, the etching rate is defined by the hardness. It is important to set the hardness of the second refill film 8 to be lower than that of the first refill film 7. It is preferable to use the insulating material with high hardness for forming the first refill film 7 such as alumina and Ti oxide. The hardness may be compared based on Vickers hardness. In consideration with deterioration in the property of the magnetoresistive film 30 caused by the thermal process as described above, Ni oxide, Si oxide, Zr oxide, and Ta oxide may be used for forming the second refill film 8 when using alumina for forming the first refill film 7.

In the case where the reactive etching using $CO+NH_3$ gas and chlorine gas is performed as the first etching in the track width forming step, the etching rate is defined by the steam pressure of the reaction product. It is preferable to set the steam pressure of the reaction product of the second refill film 8 to be higher than that of the reaction product of the first refill film 7.

Figure 6D:
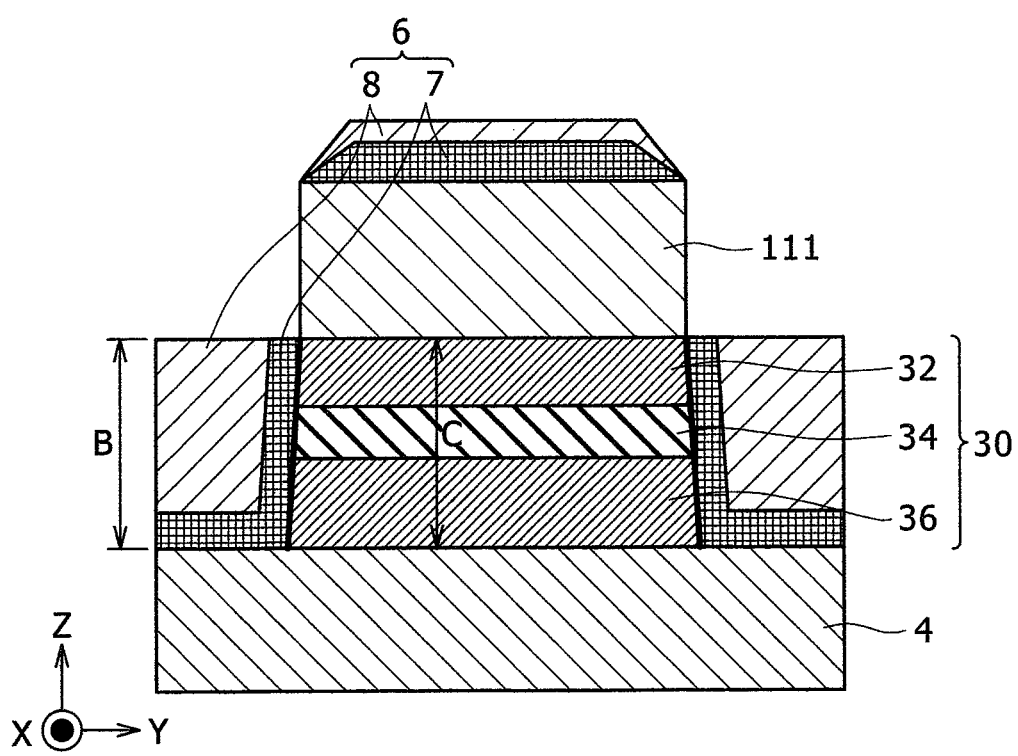
FIG. 6D is a sectional view of the magnetic reproduction head in the element height direction according to the first embodiment in the manufacturing process.
Figure 6E:
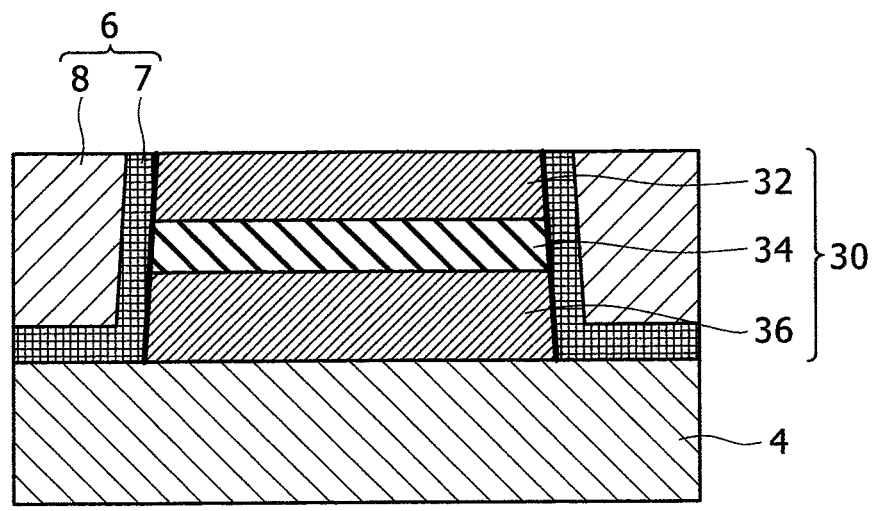
FIG. 6E is a sectional view of the magnetic reproduction head in the element height direction according to the first embodiment in the manufacturing process.

The refill film 6 in the element height direction formed of two layers has been described. Third and fourth refill films may be formed on the second refill film 8 to further form a multi-layer structure. Preferably, similarly to the second refill film 8, each of the third and the fourth refill films is formed of the material which allows the etching rate for the first etching in the track width forming step to be faster with respect to the first refill film 7. It is preferable to set the thickness B of the refill film 6 in the element height direction as shown in FIG. 6D to the value close to the thickness C of the magnetoresistive film 30 shown in FIG. 6D in order to simplify the patterning in the subsequent track width forming step. The lift-off mask 111 is removed using the organic solvent to form the shape as shown in FIG. 6E.

Subsequent to the aforementioned step, the track width is formed (not shown). Similarly to the case for forming the element height, when forming the track width, the resist mask is prepared using the resist, or resist and PMGI. Then the magnetoresistive film 30 is subjected to the dry etching (first etching) such as the ion beam etching and the reactive ion etching (RIE) to form the track width through the etching. Subsequent to the first etching, the etching (second etching) at the second incident angle larger than that of the first etching with respect to the substrate is performed to remove the reattachment adhered onto the wall surface at the element side during the first etching.

The refill film 6 in the element height direction is formed to have the multi-layer structure, and the second refill film 8 is formed of the material which allows the etching rate to be higher than that of the material for forming the first refill film 7. The ion beam is then sufficiently irradiated to the wall surface at the element side during the second etching so as to remove the reattachment layer sufficiently.

In the etching step, it is important to allow the insulating barrier layer 34 as the oxide film to contain at least one of nitrogen and silicon so as not to cause the oxygen loss owing to leakage of oxygen from the side wall surface of the insulating barrier layer 34 inside the magnetoresistive film 30.

The refill film 1 (second refill film) in the track width direction is formed after etching the magnetoresistive film 30 (see FIG. 1). The refill film 1 in track width direction may be formed into an arbitrary structure other than the multi-layer structure so long as the material in direct contact with the magnetoresistive film 30 is the insulating material. Preferably, the layer of the refill film 1 in the track width direction at least in direct contact with the magnetoresistive film 30 is formed of alumina. The longitudinal bias application layer or the side shield layer may be formed on the refill film 1 in the track width direction. However, such layer is not necessarily required. The resist mask is removed to form the track width using the organic solvent, for example.

Figure 6F:
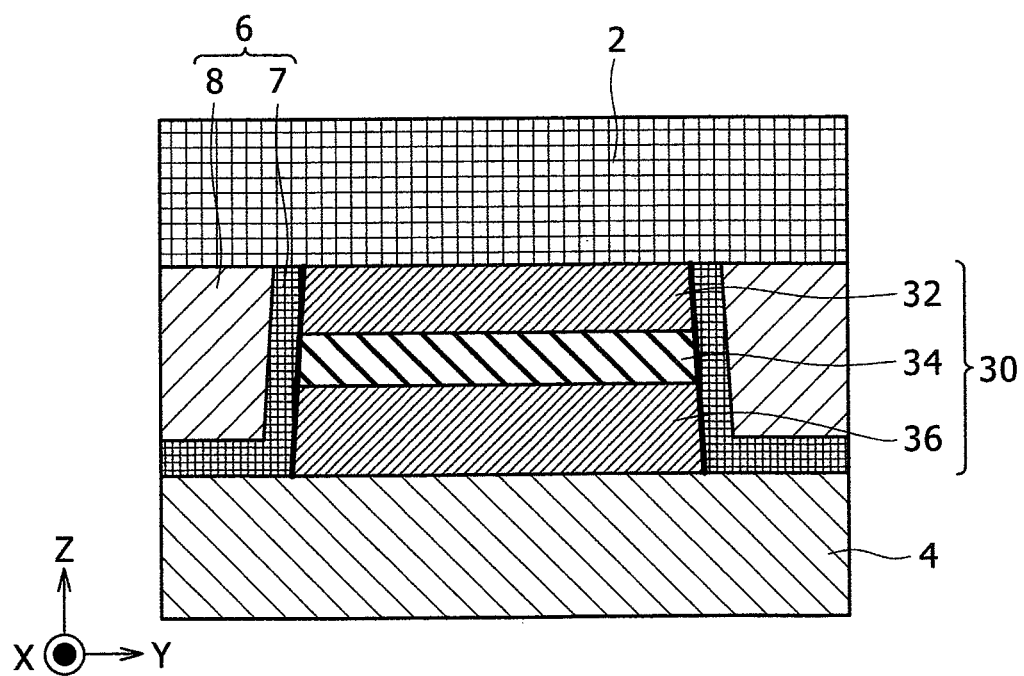
FIG. 6F is a sectional view of the magnetic reproduction head in the element height direction according to the first embodiment in the manufacturing process.
Figure 6G:
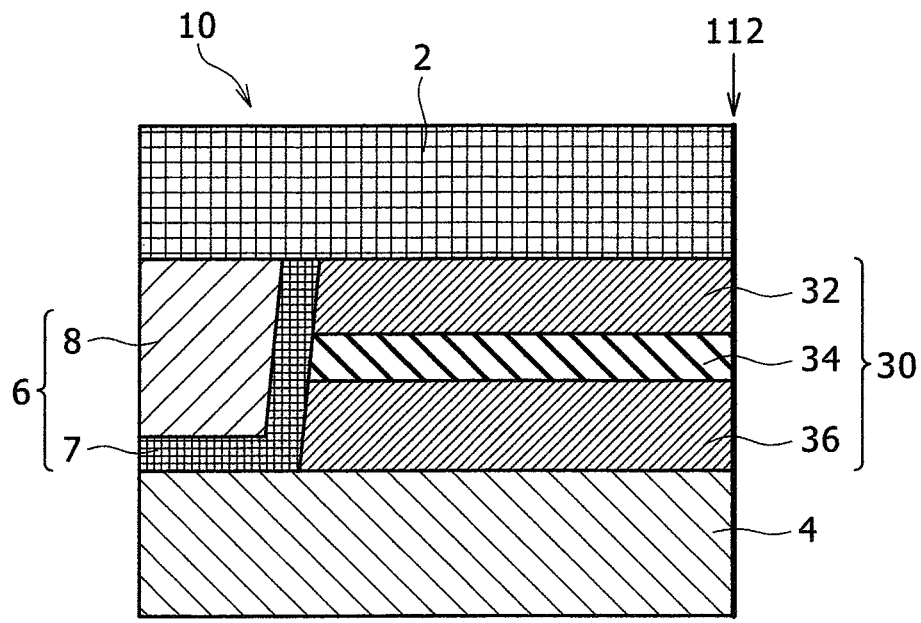
FIG. 6G is a sectional view of the magnetic reproduction head in the element height direction according to the first embodiment in the manufacturing process.

The upper magnetic shield layer 2 as the soft magnetic substance is formed on the magnetoresistive film 30 (see FIG. 6F). The upper magnetic shield layer 2 may be obtained after forming such metal as Ta, NiCr as the base layer on the magnetoresistive film 30. Thereafter, subsequent to the step of stacking the lead terminal, or the step of forming the recording element for recording the information in the medium, the medium opposing surface 112 is formed in the slider forming step to obtain the magnetic reproduction head 10 according to the first embodiment as shown in FIG. 5 (see FIG. 6G).

Figure 7:
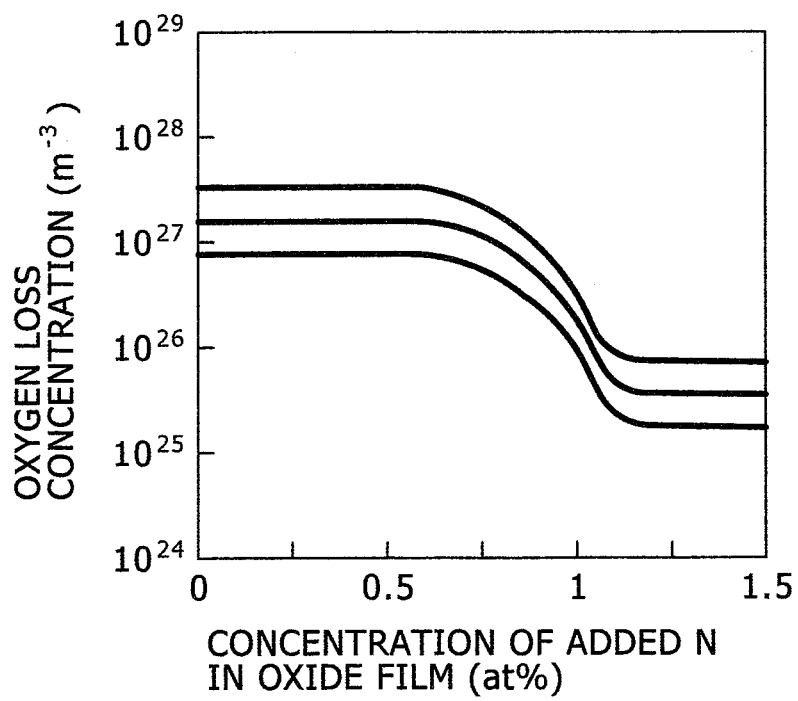
FIG. 7 is a view showing an effect of suppressing the oxygen loss in the insulating barrier layer which contains nitrogen according to the first embodiment.
Figure 8:
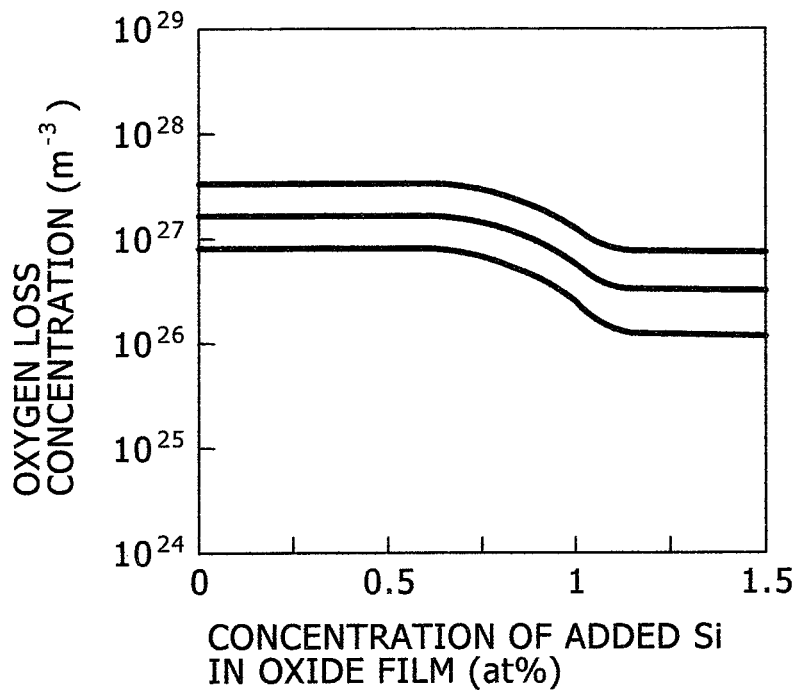
FIG. 8 is a view showing an effect of suppressing the oxygen loss in the insulating barrier layer which contains silicon according to the first embodiment.
Figure 9:
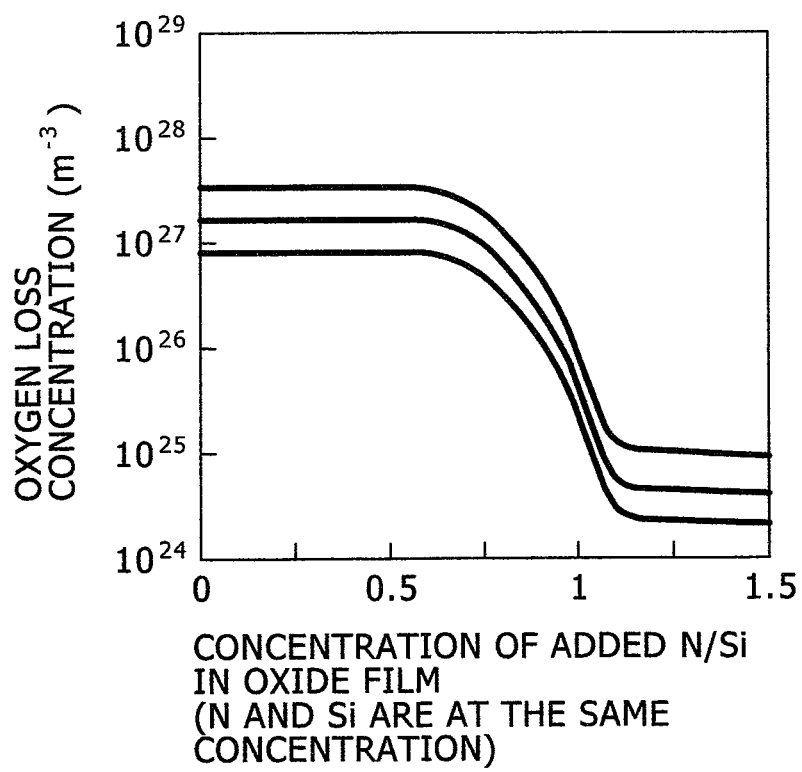
FIG. 9 is a view showing an effect of suppressing the oxygen loss in the insulating barrier layer which contains both silicon and nitrogen according to the first embodiment.

The advantageous effect for suppressing the oxygen loss by allowing the insulating barrier layer 34 as the oxide film to contain at least one of nitrogen and silicon has been described in the first embodiment. The advantageous effect with respect to the case where the track width is 30 nanometers will be described referring to FIGS. 7, 8 and 9. FIG. 7 shows the advantageous effect for suppressing the oxygen loss when nitrogen (N) is contained in the oxide film. FIG. 8 shows the advantageous effect for suppressing the oxygen loss when silicon (Si) is contained in the oxide film. FIG. 9 shows the advantageous effect for suppressing the oxygen loss when both nitrogen and silicon each at the same concentration are contained in the oxide film. The use of silicon at 1 at. % or higher achieves suppression of the oxygen loss by approximately the single digit (see FIG. 8). The use of nitrogen at 1 at. % or higher achieves suppression of the oxygen loss by approximately the two-digit (N), and the use of both nitrogen and silicon each at 1 at. % or higher achieves suppression of the oxygen loss by approximately the three-digit (see FIG. 9). The aforementioned effects may be obtained by preventing desorption of the oxygen strongly bound with silicon and nitrogen in the metal oxide film from the surface. The oxygen loss may reduce the band gap of the oxide film to allow the electron to easily flow therethrough, resulting in the leakage of the detection current. Addition of the nitrogen and silicon provides the effect for reducing leakage of the detection current by suppressing the oxygen loss. This makes it possible to improve reliability and yield of the magnetic head with the track width of 50 nanometers or less.

Second Embodiment

Figure 10:
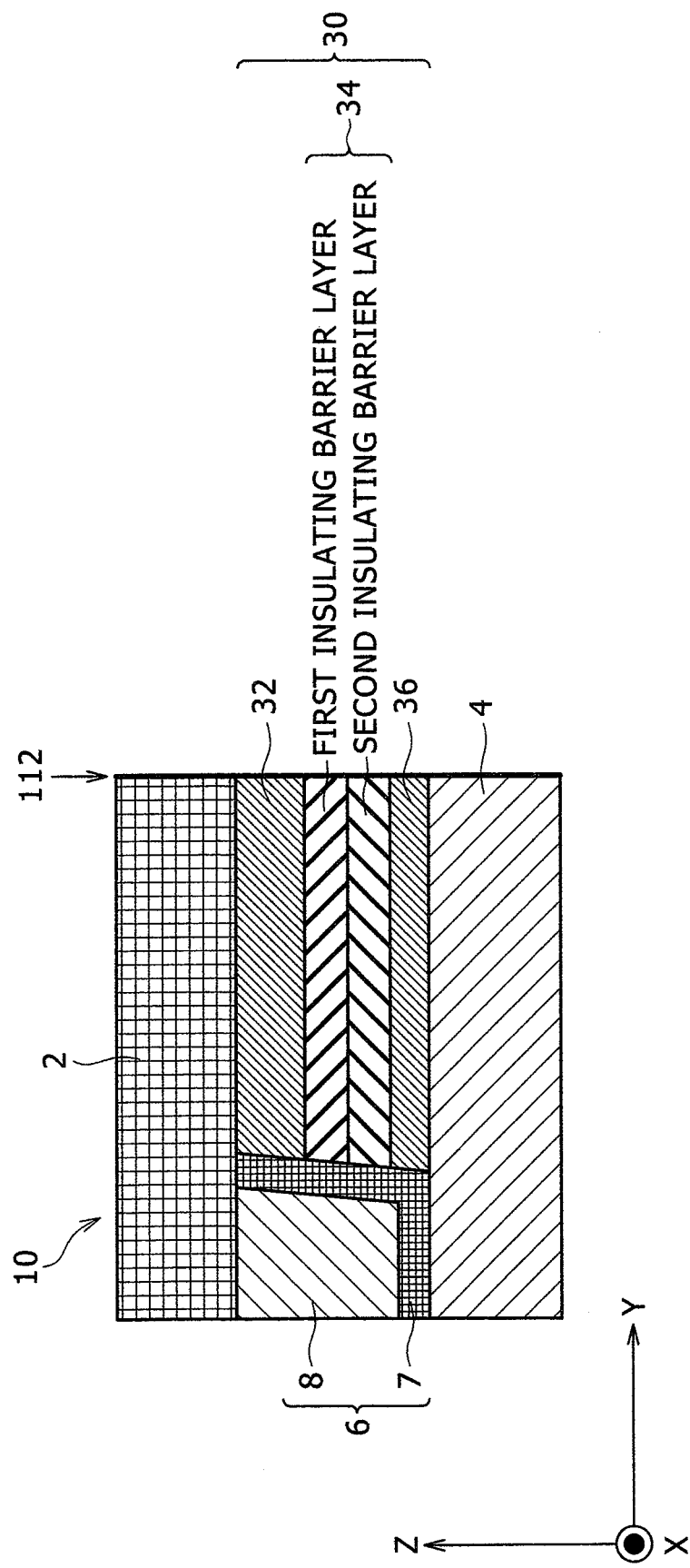
FIG. 10 is a sectional view schematically showing a magnetic reproduction head in the element height direction according to a second embodiment.

FIG. 10 shows a structure of a magnetic reproduction head 10' according to a second embodiment. The structure shown in the drawing is different from the one according to the first embodiment (FIG. 5) in that the insulating barrier layer 34 has a double-layer structure. At least one of the double layers is one of a magnesium oxide film, an aluminum oxide film, and a titanium oxide film which contains at least one of nitrogen and silicon as the additive element. This makes it possible to suppress the oxygen loss, thus reducing leakage of the detection current similarly to the first embodiment.

Third Embodiment

Figure 11:
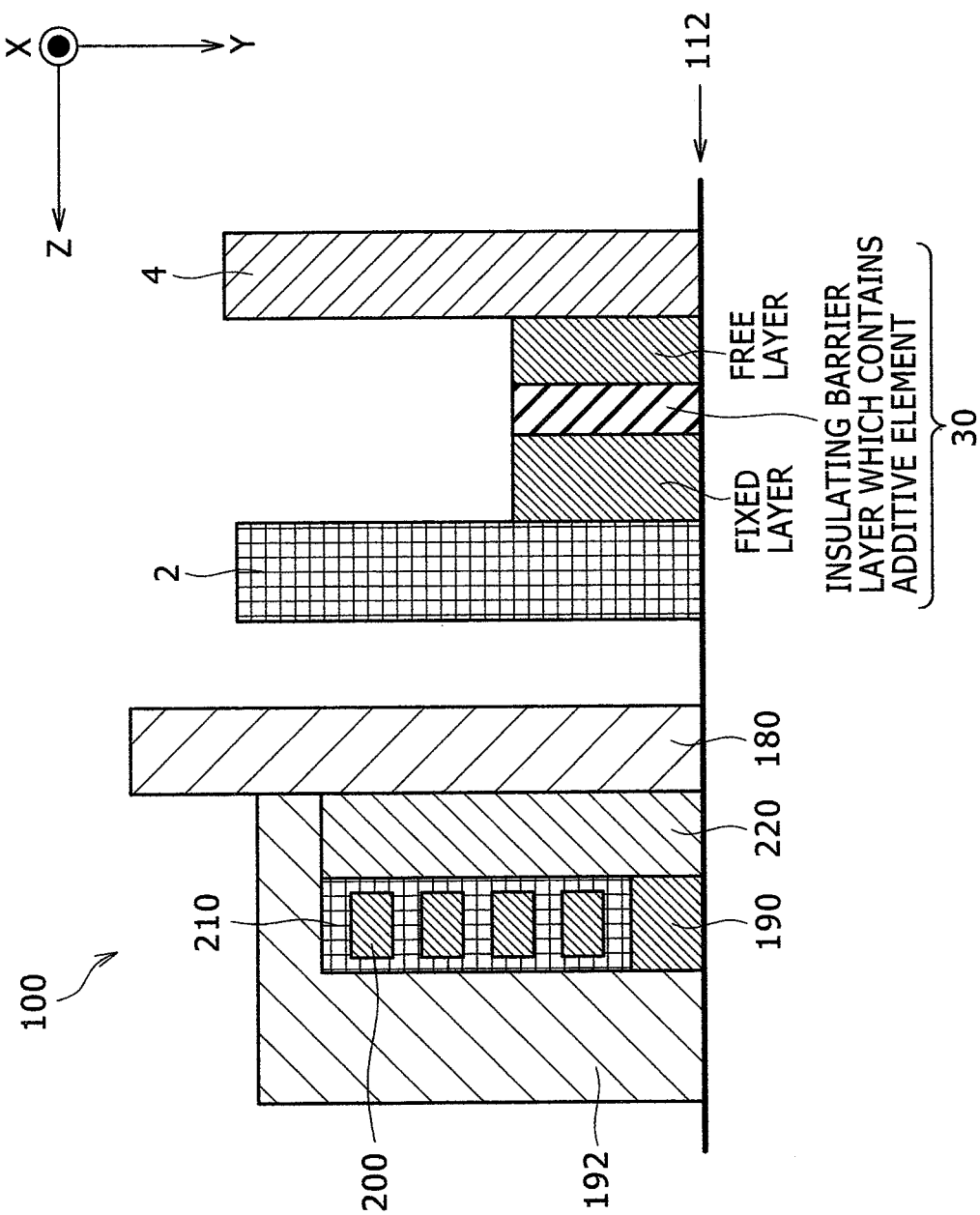
FIG. 11 is a sectional view schematically showing a magnetic head for in-plane recording according to a third embodiment.
Figure 12:
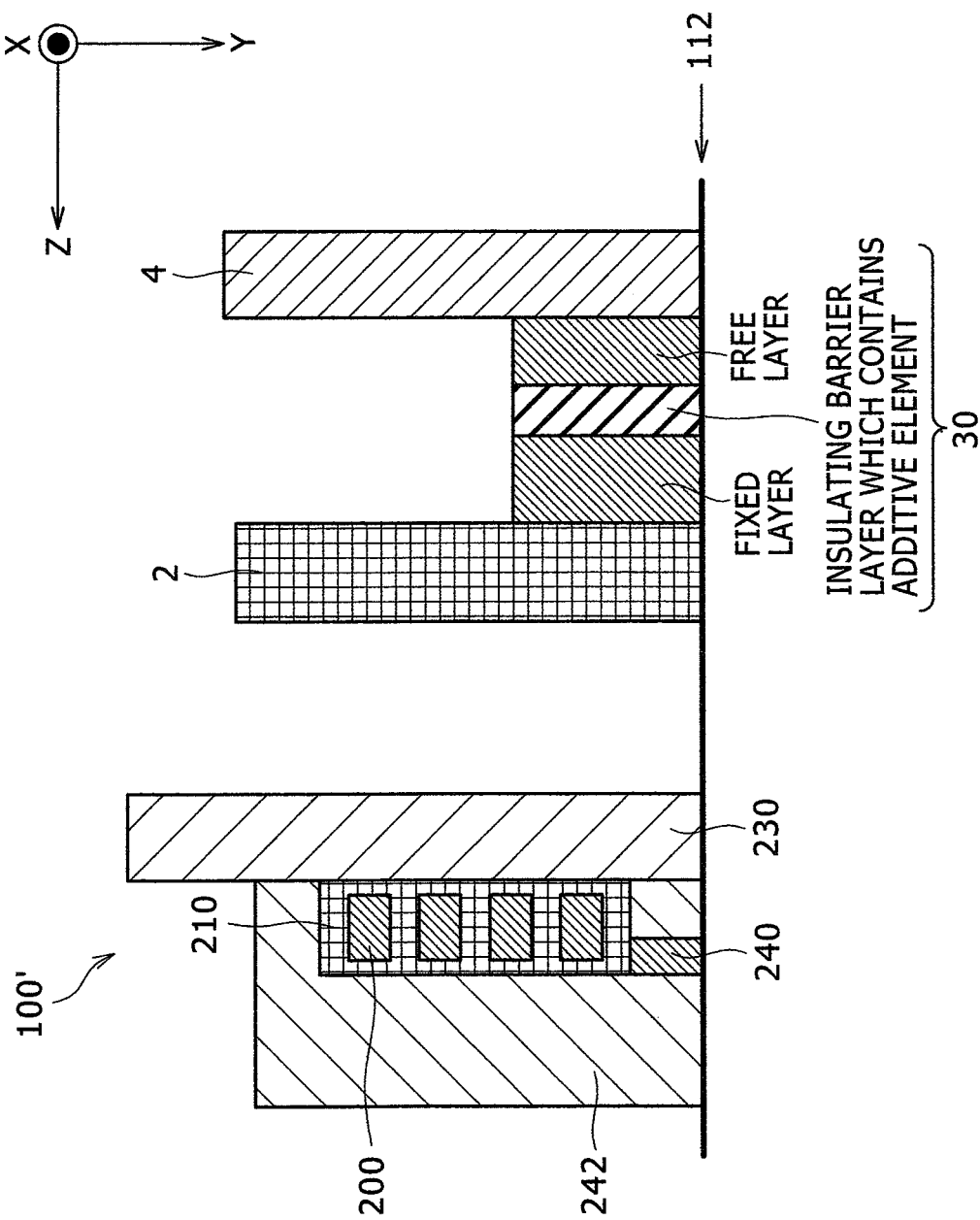
FIG. 12 is a sectional view schematically showing a magnetic head for vertical recording according to the third embodiment.

Each of FIGS. 11 and 12 is a sectional view schematically showing a magnetic head formed by combining the magnetic reproduction head 10 according to the first embodiment or the magnetic reproduction head 10' according to the second embodiment with the magnetic recording head. FIG. 11 shows a magnetic head 100 of the in-plane magnetic recording type, and FIG. 12 shows a magnetic head 100' of the vertical magnetic recording type. Referring to FIG. 11, the magnetic head 100 of in-plane magnetic recording type is a magnetic induction type head formed of a lower magnetic pole 180, a top end 190 of an upper magnetic pole, an upper magnetic pole 192, a coil 200, a coil insulating film 210, and a gap 220. Referring to FIG. 12, the magnetic head 100' of vertical magnetic recording type is a single magnetic pole head formed of an auxiliary magnetic pole 230, a main magnetic pole 240, a yoke 242, a coil 200, and a coil insulating film 210 as the magnetic recording head.

Fourth Embodiment

Figure 13:
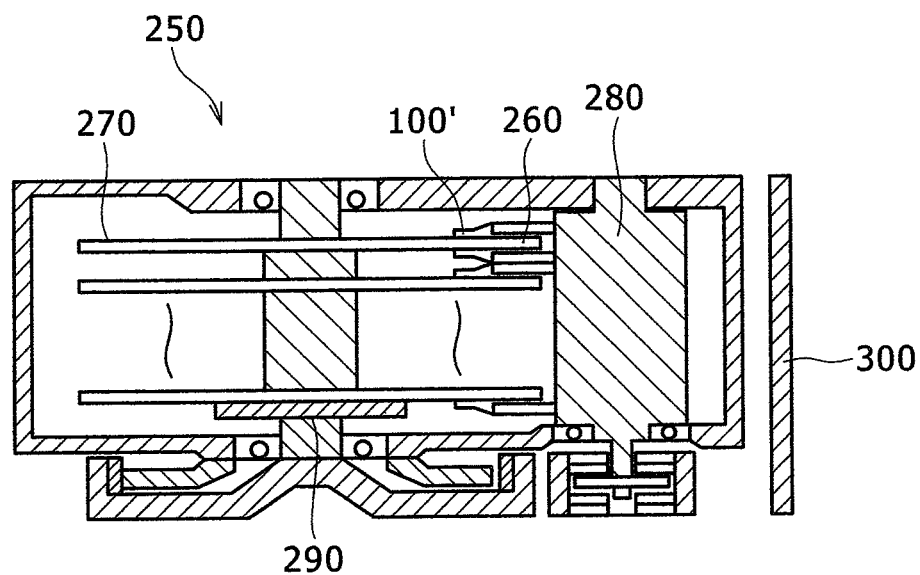
FIG. 13 is a sectional view schematically showing a magnetic recording/reproduction system according to a fourth embodiment.
Figure 14:
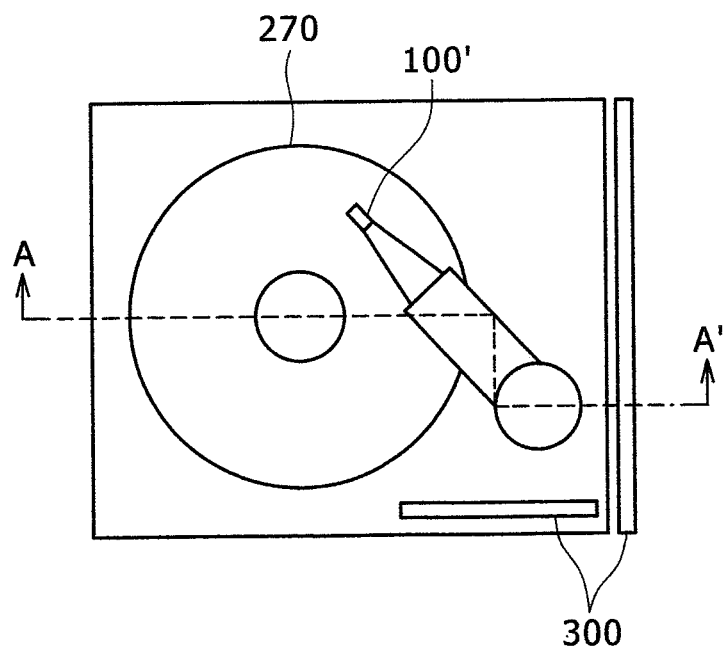
FIG. 14 is a plan view schematically showing the magnetic recording/reproduction system according to the fourth embodiment.

Each of FIGS. 13 and 14 is a view schematically showing the magnetic recording system equipped with the magnetic reproduction head according to the first or the second embodiment, or the magnetic head according to the third embodiment. A magnetic recording system 250 according to the embodiment includes a magnetic recording medium 270, a drive unit 290 for driving the medium to rotate, the magnetic head 100', a voice coil motor 280 as the drive unit for the head, and a recording/reproduction signal processor circuit 300 for the magnetic head. The magnetic head 100' may be replaced with the magnetic reproduction head according to the first or the second embodiment, or the magnetic head 100 according to the third embodiment. The magnetic head 100' is attached to the top end of the gimbal 260 so as to be driven by the voice coil motor 280 relative to the magnetic recording medium 270, and positioned on a desired point on the track. The recording signal sent from the host is transmitted to the magnetic recording head of the magnetic head 100' via the signal processor circuit 300 to subject the magnetic recording medium 270 to magnetization inversion for recording. The leaked magnetic field caused by record magnetization of the magnetic recording medium 270 is detected by the magnetic reproduction head of the magnetic head 100' so as to be processed in the signal processor circuit 300 and then transmitted to the host as the reproduction signal.

The insulating barrier layer as the oxide film in the magnetic reproduction head of the magnetic head may be one of the magnesium oxide film, aluminum oxide film, and titanium oxide film which contains at least one of nitrogen and silicon. The oxygen loss may be suppressed even if the track width becomes 50 nanometers or less, thus allowing downsizing of the track width. This makes it possible to realize the magnetic recording system with high recording density.

What is claimed is:

1. A magnetic reproduction head comprising:
   a lower magnetic shield layer;
   an upper magnetic shield layer;
   a magnetoresistive film formed between the lower magnetic shield layer and the upper magnetic shield layer;
   a first refill film in an element height direction disposed in contact with a wall surface opposite a floating surface of the magnetoresistive film; and
   a second refill film disposed in contact with both wall surfaces of the magnetoresistive film in a track width direction,
   wherein the magnetoresistive film is a tunneling magnetoresistive film which is formed on the lower magnetic shield in order of a free layer, an insulting barrier layer and a fixed layer; and
   the insulating barrier layer is formed of an oxide film as one of a magnesium oxide film, an aluminum oxide film, and a titanium oxide film, the oxide film previously includes a total amount more than 1 at % of nitrogen and silicon, before etching to the insulating barrier layer, in order to decrease oxygen loss from both sides of the insulating barrier layer of the magnetoresistive film, the oxygen loss is caused by etching of the insulating barrier layer.

2. The magnetic reproduction head according to claim 1, wherein the insulating barrier layer is formed of two or more layers, and at least one of the two or more layers is the oxide film as one of a magnesium oxide film, an aluminum oxide film, and a titanium oxide film which contains a total amount more than 1 at % of at least one of the nitrogen and the silicon.

3. A magnetic head comprising the magnetic reproduction head according to claim 2, and a magnetic recording head.

4. A magnetic head comprising the magnetic reproduction head according to claim 1, and a magnetic recording head.

5. The magnetic head according to claim 4, wherein the magnetic recording head is a single magnetic pole head for vertical recording.

6. The magnetic head according to claim 4, wherein the magnetic recording head is a magnetic induction head.

7. A magnetic recording system comprising:
   a drive unit for driving a magnetic recording medium in a recording direction;
   the magnetic head according to claim 4;
   a unit for activating the magnetic head relative to the magnetic recording medium; and
   a recording/reproduction unit for inputting a signal to the magnetic head and reproducing a signal output from the magnetic head.

* * * * *